(12) United States Patent
Larsen et al.

(10) Patent No.: US 6,407,611 B1
(45) Date of Patent: Jun. 18, 2002

(54) SYSTEM AND METHOD FOR PROVIDING AUTOMATIC COMPENSATION OF IC DESIGN PARAMETERS THAT VARY AS A RESULT OF NATURAL PROCESS VARIATION

(75) Inventors: Frode Larsen, Tinton Falls; Sam Olu George, Lakewood, both of NJ (US)

(73) Assignee: Globespan, Inc., Red Bank, NJ (US)

(*) Notice: Subject to any disclaimer, the term of this patent is extended or adjusted under 35 U.S.C. 154(b) by 0 days.

(21) Appl. No.: 09/382,298

(22) Filed: Aug. 24, 1999

Related U.S. Application Data

(60) Provisional application No. 60/098,317, filed on Aug. 28, 1998.

(51) Int. Cl.[7] .................................................. G06G 7/12
(52) U.S. Cl. ........................................ 327/362; 327/362
(58) Field of Search ........................... 327/52, 362, 378, 327/382, 389, 391, 399, 404, 427, 561, 562, 563; 323/313–316

(56) References Cited

U.S. PATENT DOCUMENTS

| | | | | |
|---|---|---|---|---|
| 5,495,166 A | * | 2/1996 | Alini et al. | 323/314 |
| 5,796,244 A | * | 8/1998 | Chen et al. | 323/313 |
| 5,955,873 A | * | 9/1999 | Maccarrone et al. | 323/314 |

* cited by examiner

*Primary Examiner*—My-Trang Nu Ton
(74) *Attorney, Agent, or Firm*—Thomas, Kayden, Horstemeyer & Risley

(57) ABSTRACT

A system and method for providing automatic compensation of IC design parameters that vary as a result of natural process variation is disclosed. In a simplified embodiment, the difference in voltages, $\Delta V_{GS}$, between two identical diode-connected MOSFETs, which are biased with currents that are known to be different in value, is determined. $\Delta V_{GS}$ is inversely proportional to the transconductance of the first of the two diode-connected MOSFETs, which is also biased with a current, $I_D$. A relationship that embodies a direct proportionality between the transconductance of the first diode-connected MOSFET and a circuit performance parameter is derived, thereby establishing a relationship between $\Delta V_{GS}$ and the circuit performance parameter. Process compensation is then implemented, comparing known reference voltages with $\Delta V_{GS}$. The outputs of the comparison are latched into digital decoding logic which provides coarse steering (process compensation) current to a functional circuit, thereby centering the circuit with respect to process.

22 Claims, 4 Drawing Sheets

SYSTEM AND METHOD FOR PROVIDING AUTOMATIC COMPENSATION OF IC DESIGN PARAMETERS THAT VARY AS A RESULT OF NATURAL PROCESS VARIATION

CROSS-REFERENCE TO RELATED APPLICATIONS

This application claims the benefit of U.S. Provisional Application Serial No. 60/098,317, filed on Aug. 28, 1998, and entitled "Process Independent Ring Oscillator/VCO," which is incorporated by reference herein in its entirety.

FIELD OF THE INVENTION

The present invention relates generally to CMOS integrated circuit design and fabrication, and, more particularly, to a method for compensating key circuit design parameters that may vary from one semiconductor wafer to the next.

BACKGROUND OF THE INVENTION

The fabrication of a semiconductor integrated circuit (IC) relies on successful exploitation of the electrical characteristics of active devices, such as transistors, and passive devices, such as resistors, capacitors, and inductors, in a wide variety of circuit topologies. In order for the IC to produce desired electrical performance, each of its constituent circuit solutions exercises fundamental parameters of the devices offered in the CMOS process.

As examples, some critical electrical MOSFET parameters include, but are not limited to, threshold voltage ($V_{th}$), transconductance ($g_m$), width of channel (W), length of channel (L) and oxide thickness ($t_{ox}$). These electrical parameters are defined by the physics of the methods and materials used to fabricate the IC. For example, $V_{th}$ is a function of doping concentrations, equilibrium electrostatic potential, and a number of other intrinsic properties of the semiconductor wafer.

As is well known, each intrinsic physical property of the semiconductor wafer exhibits some statistical variation, which, for a tightly controlled process, is a Gaussian distribution. While, from one wafer-lot to the next, some physical parameters track closely, a large number do not. In this context, the term "track" refers to correlation between changes in one parameter and another. In order to produce electrical model parameters for a given semiconductor process, the IC foundry utilizes mathematical/empirical methods to process parametric data from thousands of wafers. Reflecting the statistical nature of the physical properties of the wafers, the extracted electrical parameters also exhibit statistical variation.

To illustrate this point, an average BSIM3v3 MOSFET model contains about 200 electrical parameters. As noted above, many of these electrical model parameters are uncorrelated. The statistical variations, coupled with parameter "uncorrelatedness," lead to large changes in circuit performance parameters from one wafer-lot to another. For example, the center-frequency of a voltage controlled oscillator (VCO), nominally designed for 200 MHz, may be 50 MHz for ICs in one wafer-lot and 500 MHz for ICs in another wafer-lot. Such wide variation in electrical performance parameters is undesirable in many circuit applications.

There are a number of widely used methods for making circuit performance parameters insensitive to process variation. One expensive method is external trimming; i.e., laser wafer trimming, electrical and other fuses, or external digital correction through a digital signal processor (DSP). Another common method is to extend the range of the circuit performance parameters to allow for very wide tolerances. For example, one could use the VCO discussed hereinabove in a phase locked loop (PLL) application. However, such wide variations penalize circuit performance. In the case of a PLL, wide variation in VCO tuning range leads to such problems as excessive phase noise, excessive power consumption, and poor lock-up times.

SUMMARY OF THE INVENTION

In light of the foregoing, the invention provides an efficient method for automatic process compensation of circuit performance parameters, thereby eliminating costly trimming methods or performance degradation attributed to designing for large parameter tolerances.

Generally, the first embodiment of the system of the invention utilizes the difference in voltages between two identical diode-connected MOSFETs which are biased with currents that are known to be different in value. To the first order, the voltage difference tracks variation in transconductance for a given class of MOSFETs (N-MOSFETs or P-MOSFETs) across a given IC. For a given IC, a designer selects a dominant device-type that strongly influences the architectures of circuits implemented on the IC. This dominant device-type is determined by the 2 diode-connected MOSFETs used in the process detection/compensation circuit. The voltage-difference, $\Delta V_{GS}$, of the two diode connected MOSFETs is then determined, being inversely proportional to the transconductance, hereinafter $g_m$, of the first of the two diode-connected MOSFETs, which is also biased with a current, $I_D$. Herein, $\Delta V_{GS}$ is also referred to as the "process-state sensor."

A variable, $\mathfrak{R}$, represents some circuit performance parameter, such as, but not limited to, the center-frequency of a VCO, or the bandwidth of an amplifier. The circuit designer then derives a relationship that embodies a direct proportionality between $g_m$ and $\mathfrak{R}$. Thus, for the given class of dominant devices, a relationship is established between $\Delta V_{GS}$, the process-state sensor, and the circuit performance parameter, $\mathfrak{R}$, and as a result, the process dependent parameter, $g_m$, is eliminated. Process compensation is then implemented, wherein a comparator compares known reference voltages with $\Delta V_{GS}$. The outputs of the comparator are latched into digital decoding logic which provides coarse steering (process compensation) current to a functional circuit, thereby centering the circuit with respect to process. Thus, the circuit designer can realize circuit designs that utilize the given class of dominant design devices, to obtain process independent design parameters.

The invention has numerous advantages, a few of which are delineated hereinafter as examples. Note that the embodiments of the invention described herein possess one or more, but not necessarily all, of the advantages set out hereafter.

One advantage of the invention is that it allows an IC designer to center IC performance parameters very close to a Guassian nominal without resorting to costly trimming. This allows the IC designer to seek optimum circuit performance within a narrow, tightly controlled model space.

Another advantage of the present invention is that it provides a method of making IC electrical performance parameters process independent with minimal increase to the power consumption of the IC.

Another advantage of the present invention is that it eliminates a large amount of design-time required to produce a robust circuit design through numerous process-corner simulations. Therefore, the designer need not focus on exhaustive verification simulations in order to ensure that the circuit performs as expected in every corner of the model space.

Another advantage of the present invention is that it does not require external control through a DSP. All correction is done automatically on-chip.

Other features and advantages of the present invention will become apparent to one of reasonable skill in the art upon examination of the following drawings and detailed description. It is intended that all such additional objects, features, and advantages be included herein within the scope of the present invention, as defined by the claims.

BRIEF DESCRIPTION OF THE DRAWINGS

The present invention will be more fully understood from the accompanying drawings of the embodiments of the invention, which however, should not be taken to limit the invention to the specific embodiments enumerated, but are for explanation and for better understanding only. Furthermore, the drawings are not necessarily to scale, emphasis instead being placed upon clearly illustrating the principles of the invention. Finally, like reference numerals in the figures designate corresponding parts throughout the several drawings.

DETAILED DESCRIPTION OF THE PREFERRED EMBODIMENT

The compensation method of the present invention can be implemented in hardware, software, firmware, or a combination thereof. In the preferred embodiment, the compensation method is implemented in hardware. As a hardware solution, the compensation method can be implemented with any or a combination of the following technologies, which are all well known in the art: discrete transistors for analog signal processing and logic gates for implementing logic functions, an application specific integrated circuit (ASIC) having transistors for analog signal processing and for digital signal processing, a transistor array for analog signal processing in conjunction with a field programmable gate array (FPGA), etc.

Figure 1:
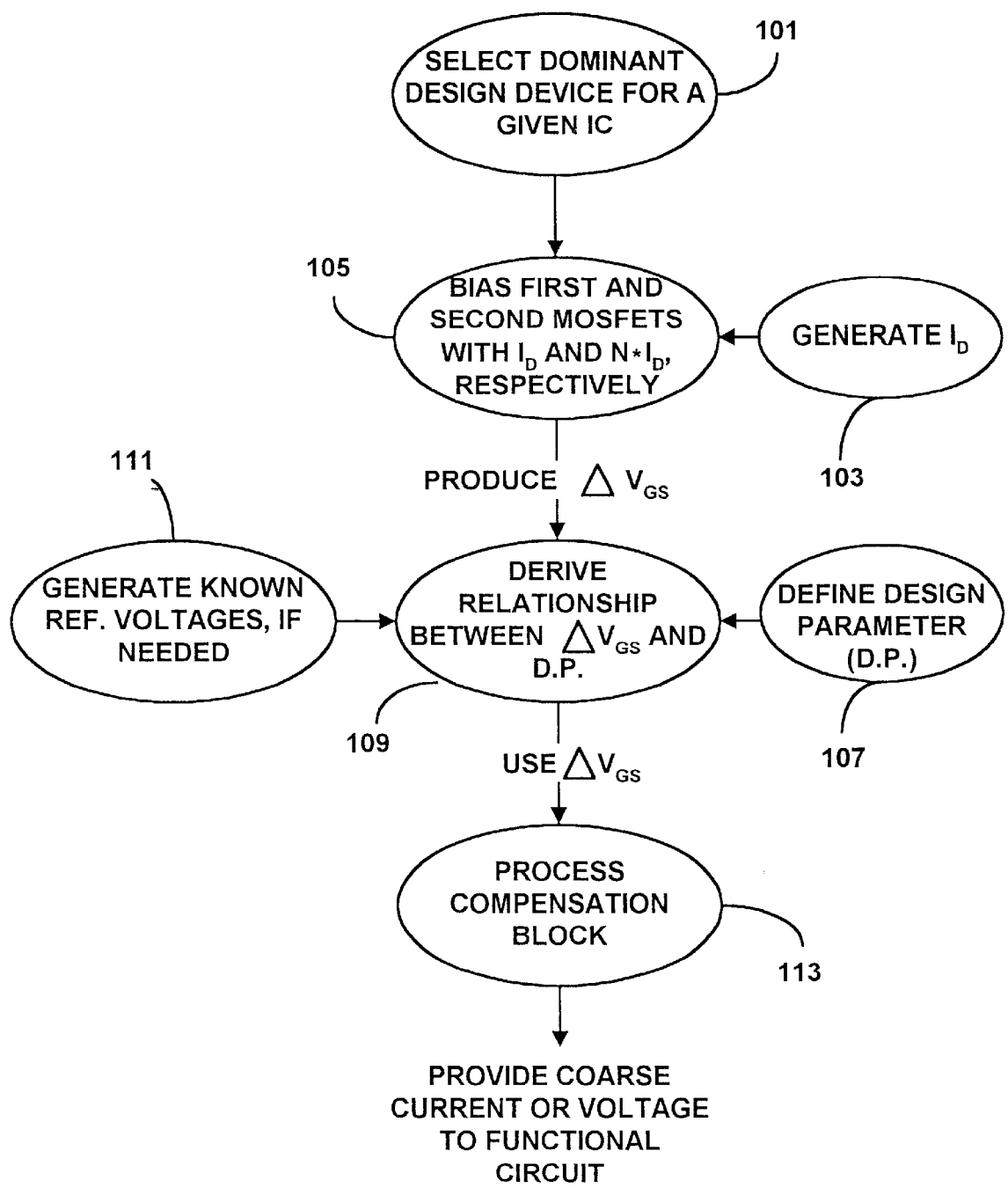
FIG. 1 shows a structured flow diagram encapsulating key design steps of the present process compensation method.

Turning now to the drawings, wherein like reference numerals designate corresponding parts throughout the drawings, FIG. 1 shows a structured flow diagram depicting how the compensation method of the present invention is utilized in order to allow a circuit designer to obtain process independent design parameters. The flow diagram of FIG. 1 shows the architecture, functionality, and operation of a possible implementation of the compensation method. It should also be noted that in some alternative implementations, the functions noted may occur out of the order noted in FIG. 1. For example, two steps shown in succession in FIG. 1 may in fact be executed substantially concurrently or the steps may sometimes be executed in the reverse order, depending upon the functionality involved, as will be further clarified hereinbelow.

In accordance with the preferred embodiment of the invention, a circuit designer first selects a dominant design device, such as, but not limited to N-MOSFET or P-MOSFET (block 101). In this context, "dominant" refers to the device type that has electrical characteristics that largely determine the mathematics of the design parameter (s) in question. For example, a $g_m$-C filter's cutoff frequency (i.e., the design parameter) is defined by the $g_m$ of the dominant devices used in the transconductance cells of the filter.

The choice of a dominant device type relies on the fact that the physical properties of all such devices track across the IC, or wafer. That these physical properties track allows the designer to implement a circuit solution to produce design parameters defined by a common electrical property of the dominant device, an example being $g_m$. The following description has been provided with consideration of N-MOSFET devices as the dominant design device. It should be noted that one of reasonable skill in the art would understand how to implement the utilization of P-MOSFET devices as the dominant design device in the present compensation method.

As depicted by block 105, two identical matched dominant MOSFETs, 121 and 123, are biased with process-independent currents $I_D$ and $n \times I_D$, respectively. $I_D$ may be derived from a fixed current reference, such as, but not limited to, a bandgap current reference (BGIR) (block 103). In accordance with the preferred embodiment of the invention, the variable "n" is an integer that produces a $\Delta V_{GS}$ of several hundred mV. As is well known in the art, the term "matched," as abovementioned, means that the two devices are physically identical and as close as possible in the topological layout of the IC.

The first-order transconductance, $g_m$, of MOSFET 121 may be represented by Eq. 1, $$g_m = 2 \cdot \sqrt{\mu \cdot C_{ox} \cdot \left(\frac{W}{L}\right) \cdot I_D} \qquad \text{(Eq. 1)}$$

wherein, $\mu$=electron mobility;

$$C_{ox} = \frac{\varepsilon_0 \cdot \varepsilon_r}{t_{ox}},$$

wherein $\epsilon_0$ & $\epsilon_r$ are the relative permitivities of free space and silicon, respectively; $t_{ox}$=gate-channel thickness of the MOSFET in question; W=width of channel; L=length of channel; and $I_D$ is a process independent bias current, such as that from a BGIR.

Referring back to FIG. 1, this bias scheme produces a difference voltage, $\Delta V_{GS}$. $\Delta V_{GS}$, as defined hereinafter by equation 2, is inversely proportional to the $g_m$ of MOSFET 121, representing the "process sensing" portion of this embodiment. For practical implementation, $\Delta V_{GS}$ is on the order of several hundred mV. As previously stated, the principle behind dominant device selection is that the physical, and hence electrical, properties of all devices of the same type on the given wafer track.

In accordance with the preferred embodiment of the invention, a design parameter (e.g., VCO center frequency, filter cutoff frequency, etc.), $\Re$, is then established (block 107), wherein $\Re$ is defined by the $g_m$ of the dominant devices used to create the relevant circuit. A desired mathematical relationship, $\Re \propto g_m$, is then obtained. $\Delta V_{GS}$ is inversely related to $\Re$, thereby eliminating the process dependent parameter, $g_m$, from the governing design-parameter relationship (block 109). For simplicity, the scaling parameters necessary for mathematical consistency are not discussed. As depicted by block 111, known reference voltages are also introduced into the present method for purposes that shall be described hereinbelow.

Process compensation (block 113) is then implemented as follows. In accordance with the preferred embodiment of the invention, the process compensation method is implemented as a digital method. The digital method first uses open-loop differential differencing amplifier (DDA) comparators to compare the known reference voltages with $\Delta V_{GS}$. The outputs of these comparators are latched into digital decoding logic. This logic element provides coarse steering (process compensation) voltages or currents to the functional circuit.

In accordance with an alternative embodiment of the present invention, a continuous-time analog method is used. The continuous-time analog method uses a negative feedback DDA to produce a current that is directly proportional to $\Delta V_{GS}$ and, by deliberate circuit design, inversely proportional to $\Re$. This current is then provided to a functional circuit, thereby centering the circuit with respect to process.

Figure 2:
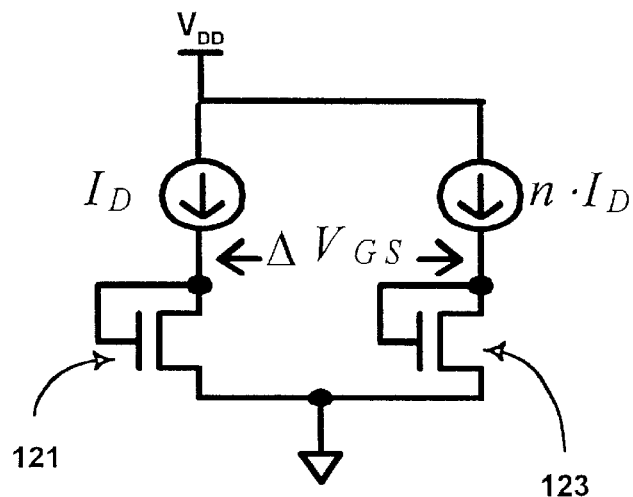
FIG. 2 is a schematic of a circuit that generates $\Delta V_{GS}$ from 2 diode-connected MOSFETs.

FIG. 2 illustrates the circuit utilized to derive $\Delta V_{GS}$ in accordance with the preferred embodiment of the invention. As stated in the description of block 105 (FIG. 1), the matched MOSFETs 121 and 123 are biased with process-independent currents $I_D$ and $n \times I_D$, respectively. $I_D$ may be derived from a fixed current reference, such as, but not limited to, a bandgap current reference, BGIR. The term "n" is some integer that produces a $\Delta V_{GS}$ of several hundred mV.

As stated earlier, $\Delta V_{GS}$ represents the difference voltage between the gate-source voltages of the matched MOSFETs with different bias currents. Thus, $\Delta V_{GS} = V_{GS(121)} - V_{GS(123)}$. Alternatively, $\Delta V_{GS}$ may be represented by the following Eq. 2, $$\Delta V_{GS} = \left(\frac{2 \cdot I_D}{g_m}\right) \cdot (1 - \sqrt{n}) \quad \text{(Eq. 2)}$$

wherein $g_m$ is the transconductance of MOSFET 121.

Figure 3:
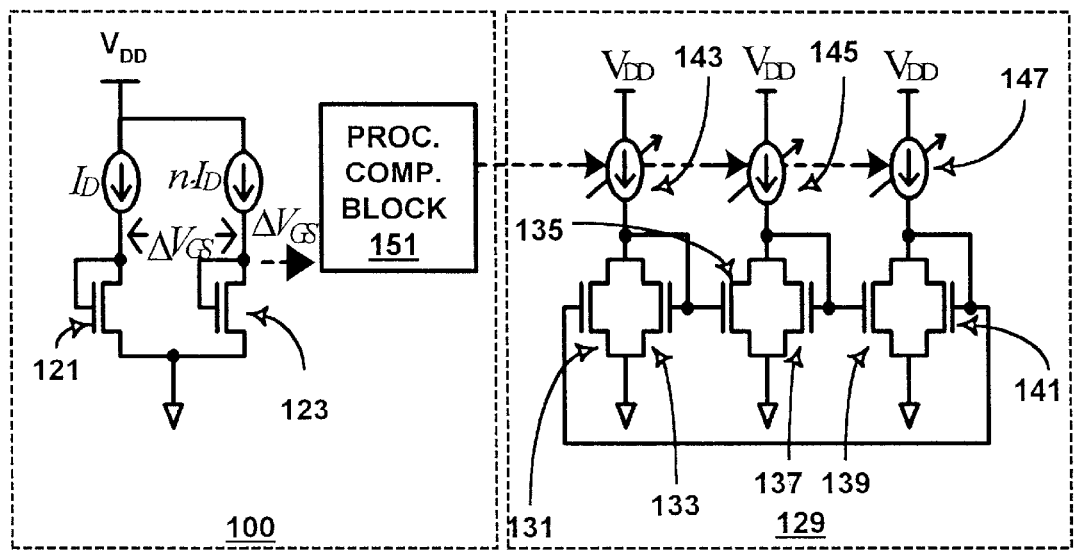
FIG. 3 is a drawing illustrating the use of $\Delta V_{GS}$ to provide the coarse, or process compensation, current for a current steering VCO using the circuit of FIG. 2.

FIG. 3 demonstrates the application of the present process compensation method (100) to a current steering VCO 129. As stated earlier, the dominant design devices are N-MOSFETs, thus, in accordance with the preferred embodiment of the invention, transistors 131, 133, 135, 137, 139, and 141 are N-MOSFETs. As is well known to one of reasonable skill in the art, the combination of devices 131, 133, 135, 137, 139, and 141 act in combination with variable current sources 143, 145, and 147 to promote oscillation of the VCO (129). Each current source produces a current comprising of two components defined by 2 tuning ports. One component, the coarse (process compensation) current, is tuned by a process compensation block 151. The second tuning port is the "normal" current control for the VCO 129.

As shown in FIG. 3, $\Delta V_{GS}$ is introduced into the process compensation block 151, embodiments of which are described with reference to FIG. 4 and FIG. 5 hereinbelow. The process compensation block 151 utilizes $\Delta V_{GS}$ to produce a coarse current which "centers" the VCO 129 with respect to process, as would be understood by one of reasonable skill in the art.

In a large number of circuit solutions, critical performance parameters depend on the ratio of $g_m/C_{Load}$. As an example, particular to the presently described VCO 129, the speed ($f_{osc}$) depends on the $g_m/C_{Load}$ of the N-MOSFETs. This fact may be captured by the relationship shown in Eq. 3.

$$f_{osc} \propto \frac{g_m}{C_{Load}} \quad \text{(Eq. 3)}$$

Manipulation of Eq. 2 and Eq. 3 leads to the relationship shown in Eq. 4:

$$f_{osc} \propto \frac{1}{\Delta V_{GS}} \quad \text{(Eq. 4)}$$

Eq. 4 shows a first-order inverse relationship between a circuit performance parameter, $f_{osc}$ for this VCO example, and $\Delta V_{GS}$. Hence, with appropriate scaling of circuit constants, process compensation is achieved by elimination of $g_m$.

As stated above, the present process compensation method may be applied in a number of circuit solutions. For example, the present process compensation of transconductance may be utilized in $g_m$-C filters, voltage-to current-converters, and amplifiers.

Figure 4:
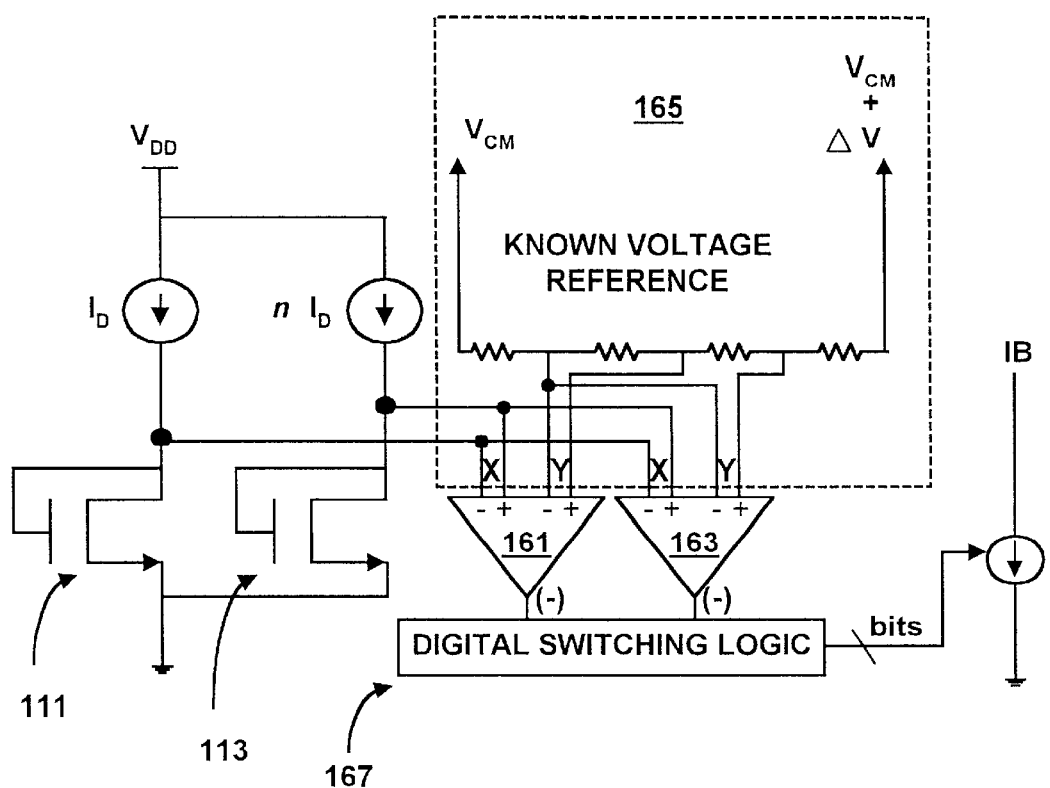
FIG. 4 is a drawing that further illustrates the process compensation block shown in FIG. 3, which uses DDAs, operated as open-loop comparators, to compare the $\Delta V_{GS}$ of FIGS. 1 and 2, with reference voltages from a known reference ladder.

One possible digital implementation of the process compensation block 151 of FIG. 3 is shown by FIG. 4. It should be noted that other digital implementations of the process compensation block 151 may be used and are intended to be incorporated herein. The present digital implementation utilizes DDAs 161 and 163, to compare $\Delta V_{GS}$ against a known voltage reference ladder 165, wherein the DDAs 161, 163 are configured for open-loop comparator operation. It should be noted that the circuit designer may extend the resolution of this scheme with additional DDAs.

The DDAs 161, 163 are configured for open-loop comparator operation. They compare $\Delta V_{GS}$ with the known reference ladder 165 in order to produce a weighted bit-pattern. Particularly, $\Delta V_{GS}$ is applied to port X of DDA 161 and port X of DDA 163. Known reference voltages from the reference ladder 165 are fed into port Y of DDA 161 and port Y of DDA 163. The principle of operation is as follows: If $\Delta V_{GS}$ is smaller than the smallest reference voltage quantum, both DDA outputs are driven "high."

If $\Delta V_{GS}$ is larger than the smallest reference voltage quantum but smaller than twice the smallest reference voltage quantum, the least significant bit (LSB) DDA's (161) output is driven "low." The next "higher" DDA (163) output in the chain continues to produce a "high." Finally, if $\Delta V_{GS}$ is larger than twice the reference voltage quantum, both DDA outputs are driven "low."

The weighted bit-pattern represented by the outputs of the DDAs 161, 163 is latched and decoded by digital switching logic 167. The digital output of block 167 controls the magnitude of the coarse tuning current (IB).

Figure 5:
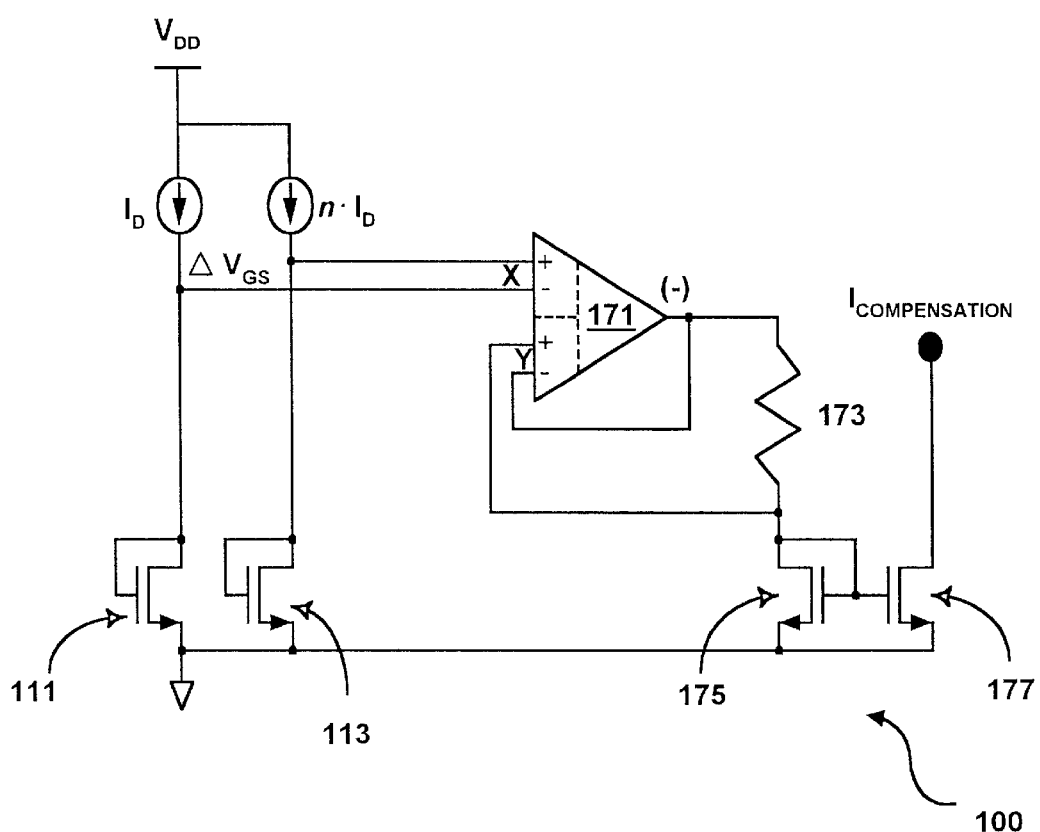
FIG. 5 is a drawing that illustrates an alternative embodiment of the invention that is a DDA-based, continuous-time analog solution.

An alternate embodiment of the invention, which has continuous analog control, is presented in FIG. 5. This circuit converts the process-sensing voltage ($\Delta V_{GS}$) into an equivalent process compensation current, as can be detected across resistor 173. In this configuration, resistor 173 is a precision "external" component and DDA 171 functions as a unity gain buffer. In accordance with this embodiment, DDA 171 senses $\Delta V_{GS}$ through port X, stabilizes and isolates the same voltage at port Y. It should be noted that resistor 173, in combination with the DDA 171, works as a voltage-to-current (V/I) converter, converting the sensed voltage, $\Delta V_{GS}$, from the DDA 171, into the process compensation current. The principle of operation of this continuous-time analog compensation method is illustrated by the following. In a "slow" process corner, where the voltage difference between DDA ports X and Y is "large," a "large" current is produced in resistor 173. Alternatively, in a "fast" process corner, where the voltage difference between DDA ports X and Y is "small," a "small" current is produced in resistor 173.

Finally, the current in resistor (173), $I_{compensation}$, is "mirrored" to the circuit of interest through MOSFETs 175 and 177. As stated with reference to FIG. 3, $I_{compensation}$ "centers" the center-frequency of the VCO 129 with respect to process.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of the present invention and protected by the following claims.

The following is claimed:

1. A method of providing compensation of integrated circuit design parameters, comprising the steps of:

biasing a first MOSFET with a first known current;

biasing a second MOSFET with a second known current;

wherein said second known current is a multiple of said first known current;

determining $\Delta V_{GS}$ of said first and second MOSFETs, wherein said $\Delta V_{GS}$ is inversely proportional to the transconductance of said first MOSFET;

determining a relationship between said transconductance and a circuit performance parameter, thereby establishing a relationship between said $\Delta V_{GS}$ and said circuit performance parameter;

implementing process compensation, wherein said $\Delta V_{GS}$ is compared to a known reference voltage; and latching an output of said process compensation step into digital decoding logic, thereby deriving a process compensation current.

2. The method of claim 1, further comprising the step of providing said process compensation current to a functional circuit.

3. The method of claim 1, wherein said first and said second MOSFETs are selected from the group consisting of N-MOSFETs and P-MOSFETs.

4. The method of claim 1, wherein said step of process compensation is performed by a multiplexer.

5. The method of claim 1, wherein said first known and said second known currents are derived from a fixed current reference.

6. The method of claim 1, wherein said first known and said second known currents are process independent currents.

7. The method of claim 6, wherein said transconductance is derived by the equation, $$g_m = 2 \cdot \sqrt{\mu \cdot C_{ox} \cdot \left(\frac{W}{L}\right) \cdot I_D},$$

wherein, $\mu$ is electron mobility;

$$C_{ox} = \frac{\varepsilon_0 \cdot \varepsilon_r}{t_{ox}},$$

where $\epsilon_0$ & $\epsilon_r$ are the relative permittivities of free space and silicon, respectively; $t_{ox}$ is the gate-channel thickness of said first MOSFET; W is the width of channel; L is the length of channel; and $I_D$ is said first known current.

8. The method of claim 1, wherein said known reference voltages are derived from a reference ladder.

9. The method of claim 1, wherein said step of implementing said process compensation is implemented as a digital method.

10. The method of claim 9, wherein said process of implementing said process compensation method is performed by at least one differential differencing amplifier.

11. The method of claim 1, wherein said step of implementing said process compensation is implemented as a continuous-time analog method.

12. The method of claim 11, wherein said continuous-time analog method utilizes a differential differencing amplifier (DDA), said DDA being configured as a unity gain buffer.

13. A system for providing compensation of integrated circuit design parameters, comprising:

a first MOSFET and a second MOSFET, wherein said first and said second MOSFET are identical;

a first bias current and a second bias current, wherein said second bias current is a multiple of said first bias current, said bias currents biasing said first MOSFET and said second MOSFET respectively;

a known reference voltage;

a process compensator, wherein said process compensator compares a $\Delta V_{GS}$, which is derived from a $V_{GS}$ of said first MOSFET and a $V_{GS}$ of said second MOSFET, to said known reference voltage; and a digital decoding logic, wherein an output of said process compensator is latched into said digital decoding logic thereby deriving a process compensation current.

14. The system of claim 13, wherein said first MOSFET and said second MOSFET are selected from the group consisting of N-MOSFETs and P-MOSFETs.

15. The system of claim 14, wherein said first bias current and said second bias current are derived from a fixed current reference.

16. The system of claim 14, wherein said first bias current and said second bias current are process independent currents.

17. The system of claim 14, wherein said known reference voltage is derived from a reference ladder.

18. The system of claim 14, wherein said process compensator is further defined by at least one differential differencing amplifier.

19. The system of claim 14, wherein said process compensator is further defined by a digital medium.

20. The system of claim 14, wherein said process compensator is further defined by an analog medium.

21. A method of providing compensation of integrated circuit design parameters, comprising the steps of:

biasing a first MOSFET with a first known current and biasing a second MOSFET with a second known current, wherein said second MOSFET is identical to said first MOSFET, and wherein said second known current is a multiple of said first known current;

determining $\Delta V_{GS}$ of said first and second MOSFETs, wherein said $\Delta V_{GS}$ is inversely proportional to the transconductance of a first of said MOSFETs;

determining a relationship between said transconductance and a circuit performance parameter, thereby establishing a relationship between said $\Delta V_{GS}$ and said circuit performance parameter;

implementing process compensation, wherein said $\Delta V_{GS}$ is compared to known reference voltages; and latching an output of said process compensation step into digital decoding logic, thereby deriving a process compensation voltage.

22. A means for providing compensation of integrated circuit design parameters comprising the steps of:

biasing a first MOSFET with a first known current and biasing a second MOSFET with a second known current, wherein said second MOSFET is identical to said first MOSFET, and wherein said second known current is a multiple of said first known current;

determining $\Delta V_{GS}$ of said first and second MOSFETs, wherein said $\Delta V_{GS}$ is inversely proportional to the transconductance of a first of said MOSFETs;

determining a relationship between said transconductance and a circuit performance parameter, thereby establishing a relationship between said $\Delta V_{GS}$ and said circuit performance parameter;

implementing process compensation, wherein said $\Delta V_{GS}$ is compared to known reference voltages; and latching an output of said process compensation step into digital decoding logic, thereby deriving a process compensation voltage.

* * * * *